United States Patent
Zhang

(10) Patent No.: US 11,765,922 B2
(45) Date of Patent: Sep. 19, 2023

(54) DISPLAY PANEL, DISPLAY DEVICE AND FABRICATING METHOD OF DISPLAY PANEL COMPRISING CARRIER FUNCTIONAL LAYER HAVING MOLECULAR CHANINS FORMED BY CROSS-LINKING UNDER LIGHT IRRADIATION

(71) Applicant: BOE Technology Group Co., Ltd., Beijing (CN)

(72) Inventor: Zhenqi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/195,714

(22) Filed: Mar. 9, 2021

(65) Prior Publication Data

US 2022/0045295 A1  Feb. 10, 2022

(30) Foreign Application Priority Data

Aug. 7, 2020 (CN) .......................... 202010789320.5

(51) Int. Cl.
*H10K 50/16* (2023.01)
*H10K 50/15* (2023.01)
(Continued)

(52) U.S. Cl.
CPC ........... *H10K 50/16* (2023.02); *H10K 50/125* (2023.02); *H10K 50/15* (2023.02); *H10K 50/17* (2023.02);
(Continued)

(58) Field of Classification Search
CPC .................................................. H01L 51/5048
See application file for complete search history.

(56) References Cited

U.S. PATENT DOCUMENTS

2014/0363913 A1* 12/2014 Park .................... H01L 27/3211
438/35
2018/0309064 A1  10/2018 Aldred et al.
(Continued)

FOREIGN PATENT DOCUMENTS

CN        106449715 A     2/2017
CN        107603340 A     1/2018
(Continued)

OTHER PUBLICATIONS

Office Action for corresponding CN 202010789320.5 dated Dec. 23, 2022.

(Continued)

*Primary Examiner* — Daniel Whalen
(74) *Attorney, Agent, or Firm* — ArentFox Schiff LLP; Michael Fainberg

(57) ABSTRACT

A display panel comprises includes: a base substrate; a first electrode layer and a second electrode layer on a side of the base substrate; a light-emitting layer between the first electrode layer and the second electrode layer; and a carrier functional layer located at least one of between the first electrode layer and the light-emitting layer, and between the second electrode layer and the light-emitting layer. The light-emitting layer has a plurality of light-emitting portions with different emergent light wavebands; and the carrier functional layer has a plurality of carrier functional portions corresponding to the plurality of light-emitting portions, the plurality of carrier functional portions having molecular chains, which is formed by cross-linking of monomers containing functional groups under light irradiation.

12 Claims, 4 Drawing Sheets

(51) Int. Cl.
  *H10K 50/17*   (2023.01)
  *H10K 50/125*  (2023.01)
  *H10K 50/852*  (2023.01)
  *H10K 59/30*   (2023.01)
  *H10K 71/00*   (2023.01)
  *H10K 71/20*   (2023.01)
  *H10K 102/00*  (2023.01)

(52) U.S. Cl.
  CPC ......... *H10K 50/171* (2023.02); *H10K 50/852* (2023.02); *H10K 59/30* (2023.02); *H10K 71/00* (2023.02); H10K 71/233 (2023.02); H10K 2102/331 (2023.02); H10K 2102/351 (2023.02)

(56) References Cited

U.S. PATENT DOCUMENTS

2019/0112491 A1    4/2019  Mei
2019/0305241 A1*  10/2019  Angioni ................. H01L 51/56

FOREIGN PATENT DOCUMENTS

CN    108137496 A    6/2018
CN    108539029 A    9/2018

OTHER PUBLICATIONS

Office Action for Chinese Application No. 202010789320.5 dated Jul. 19, 2023.

\* cited by examiner

DISPLAY PANEL, DISPLAY DEVICE AND FABRICATING METHOD OF DISPLAY PANEL COMPRISING CARRIER FUNCTIONAL LAYER HAVING MOLECULAR CHANINS FORMED BY CROSS-LINKING UNDER LIGHT IRRADIATION

CROSS REFERENCE TO RELATED APPLICATION

This application is based on and claims priority under 35 U.S.C 119 to Chinese Patent Application No. 202010789320.5, filed on Aug. 7, 2020, in the China National Intellectual Property Administration. The entire disclosure of the above application is incorporated herein by reference.

FIELD

The disclosure relates to the field of display technology, and in particular, to a display panel, a display device, and a fabricating method of a display panel.

BACKGROUND

Quantum dot patterning solutions mainly include printing, transfer, photolithography and so on. The most mature solution at present is printing, which can be implemented by organic light-emitting display panel printing equipment. The material and film thickness for each pixel can be adjusted separately, but cannot be used for high-resolution products. Printing products with the highest resolution at present have a resolution of about 250 ppi, which cannot meet the requirement of high-resolution products such as mobile phones at all.

Photolithography is an important means to achieve a high resolution. At present, there are many quantum dot light-emitting layer patterning solutions based on photolithography. However, how to pattern the corresponding carrier functional layers is a problem. That is, the prior art cannot achieve high-precision patterning of the carrier functional layers.

SUMMARY

The disclosure provides a display panel, a display device, and a fabricating method of a display panel.

Embodiments of the disclosure provide a display panel. The display panel includes: a base substrate; a first electrode layer and a second electrode layer on a side of the base substrate; a light-emitting layer between the first electrode layer and the second electrode layer; and a carrier functional layer located at least one of between the first electrode layer and the light-emitting layer, and between the second electrode layer and the light-emitting layer. The light-emitting layer has a plurality of light-emitting portions with different emergent light wavebands; and the carrier functional layer has a plurality of carrier functional portions corresponding to the plurality of light-emitting portions, the plurality of carrier functional portions having molecular chains, which is formed by cross-linking of monomers containing functional groups under light irradiation.

Embodiments of the disclosure provide a display device. The display device includes a display panel. The display panel includes: a base substrate; a first electrode layer and a second electrode layer on a side of the base substrate; a light-emitting layer between the first electrode layer and the second electrode layer; and a carrier functional layer located at least one of between the first electrode layer and the light-emitting layer, and between the second electrode layer and the light-emitting layer. The light-emitting layer has a plurality of light-emitting portions with different emergent light wavebands; and the carrier functional layer has a plurality of carrier functional portions corresponding to the plurality of light-emitting portions, the plurality of carrier functional portions having molecular chains, which is formed by cross-linking of monomers containing functional groups under light irradiation.

Embodiments of the disclosure further provide a fabricating method of the display panel according to the embodiments above. The method includes: providing the base substrate; forming the first electrode layer and the second electrode layer on the side of the base substrate; forming the light-emitting layer between the first electrode layer and the second electrode layer; forming the carrier functional layer located at least one of between the first electrode layer and the light-emitting layer, and between the second electrode layer and the light-emitting layer. Operation of forming the carrier functional layer located at least one of between the first electrode layer and the light-emitting layer, and between the second electrode layer and the light-emitting layer includes: forming a light-emitting functional film containing functional groups at least one of between the first electrode layer and the light-emitting layer, and between the second electrode layer and the light-emitting layer; irradiating the light-emitting functional film containing the functional groups shielded by a patterning mask, to allow the functional groups in the light-emitting functional film irradiated by light to be cross-linked with each other; and cleaning the light-emitting functional film in a solution, to make portions not irradiated by light, of the light-emitting functional film be dissolved in the solution and removed.

DETAILED DESCRIPTION OF THE EMBODIMENTS

To make the objectives, technical solutions and advantages of the embodiments of the present disclosure clearer, the technical solutions in the embodiments of the present disclosure will be described clearly and completely in conjunction with the accompanying drawings in the embodiments of the present disclosure. Obviously, the described embodiments are only a part of the embodiments of the present disclosure, and not all the embodiments. Based on the embodiments described herein, all other embodiments obtained by those of ordinary skill in the art without creative work shall fall into the protection scope of the present disclosure.

Unless otherwise defined, technical or scientific terms used in the present disclosure shall have the ordinary meanings understood by those of ordinary skill in the art to which the present disclosure pertains. The words "first", "second" and the like used in present disclosure do not indicate any order, quantity or importance, but are only used to distinguish different components. Words such as "comprise" or "include" mean that an element or item appearing before such a word covers listed elements or items appearing after the word and equivalents thereof, and does not exclude other elements or items. Words such as "connect" or "interconnect" are not limited to physical or mechanical connections, but may include electrical connections, regardless of direct or indirect connection. Words such as "up", "down", "left" or "right" are only used to indicate a relative positional relationship. When the absolute position of a described object changes, the relative positional relationship may also change accordingly.

To keep the following description of the embodiments of the present disclosure clear and concise, detailed description of some known functions and known components is omitted in the present disclosure.

Figure 1:
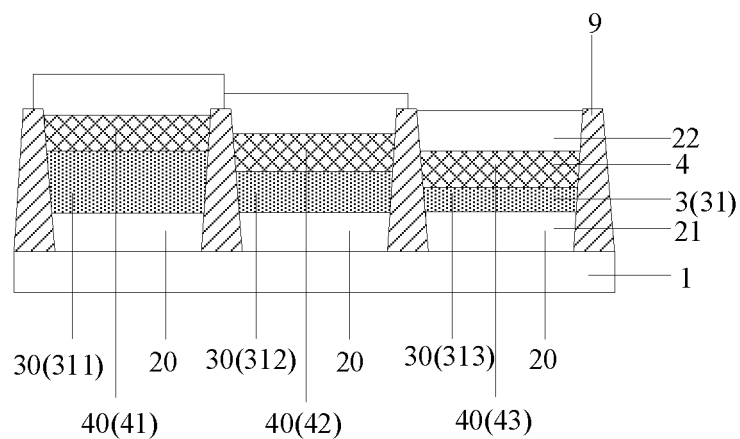
FIG. 1 is a schematic structural diagram of a display panel with a carrier functional layer only disposed between a first electrode layer and a light-emitting layer according to some embodiments.
Figure 2:
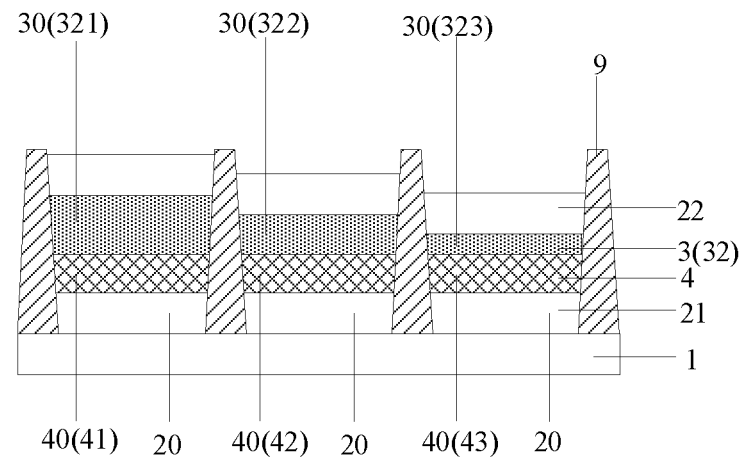
FIG. 2 is a schematic structural diagram of a display panel with a carrier functional layer only disposed between a second electrode layer and a light-emitting layer according to some embodiments.
Figure 3:
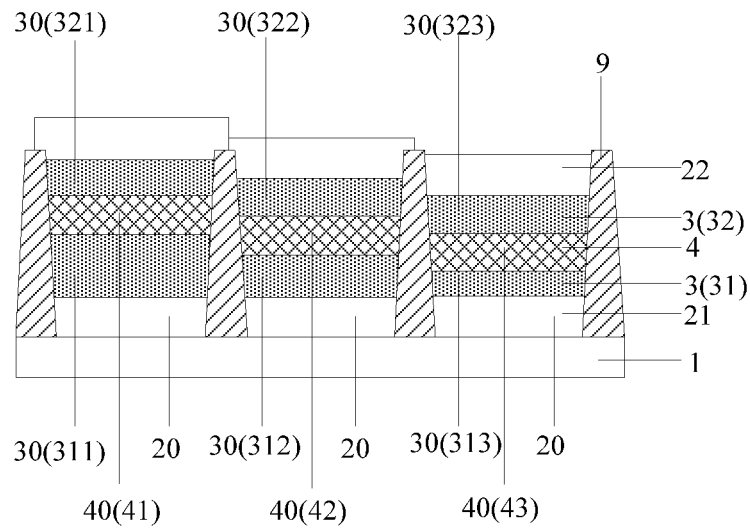
FIG. 3 is a schematic structural diagram of a display panel with a carrier functional layer disposed between a first electrode layer and a light-emitting layer, and a carrier functional layer between a second electrode layer and the light-emitting layer according to some embodiments.

In some embodiments, a display panel is illustrated as shown in FIGS. 1, 2 and 3. The display panel includes: a base substrate 1, a first electrode layer 21 and a second electrode layer 22 on a side of the base substrate 1, a light-emitting layer 4 between the first electrode layer 21 and the second electrode layer 22, and a carrier functional layer 3 located at least one of between the first electrode layer 21 and the light-emitting layer 4, and between the second electrode layer 22 and the light-emitting layer 4. For example, as shown in FIG. 1, the carrier functional layer 3 may be provided only between the first electrode layer 21 and the light-emitting layer 4. As another example, as shown in FIG. 2, the carrier functional layer 3 may be provided only between the second electrode layer 22 and the light-emitting layer 4. As another example, as shown in FIG. 3, the carrier functional layer 3 may be provided both between the first electrode layer 21 and the light-emitting layer 4, and between the second electrode layer 22 and the light-emitting layer 4. The carrier functional layer 3 located between the first electrode layer 21 and the light-emitting layer 4 may be marked as a reference character 31, and the carrier functional layer 3 located between the second electrode layer 22 and the light-emitting layer 4 may be marked as a reference character 32.

The light-emitting layer 4 has a plurality of light-emitting portions 40 with different emergent light wavebands (for example, it includes a first light-emitting portion 41 that emits light of a first waveband, a second light-emitting portion 42 that emits light of a second waveband, and a third light-emitting portion 43 that emits light of a third waveband; a wavelength range of the first waveband is greater than a wavelength range of the second waveband, and the wavelength range of the second waveband is greater than a wavelength range of the third waveband; for example, the light of first waveband is red light with a wavelength of 622 nm-760 nm, the light of second waveband is green light with a wavelength of 492 nm-577 nm, and the light of third waveband is blue light with a wavelength of 435 nm-450 nm). The carrier functional layer 3 has carrier functional portions 30 corresponding to the light-emitting portions 40. In some embodiments, the carrier functional layer 3 (31) includes a first carrier functional portion 311 corresponding to the first light-emitting portion 41, a second carrier functional portion 312 corresponding to the second light-emitting portion 42, and a third carrier functional portion 313 corresponding to the third light-emitting portion 43; and the carrier functional layer 3 (32) including a first carrier functional portion 321 corresponding to the first light-emitting portion 41, a second carrier functional portion 322 corresponding to the second light-emitting portion 42, and a third carrier functional portion 323 corresponding to the third light-emitting portion 43. An orthographic projection of the first carrier functional portion 311 on the base substrate 1 overlaps an orthographic projection of the first light-emitting portion 41 on the base substrate, an orthographic projection of the second carrier functional portion 312 on the base substrate 1 overlaps an orthographic projection of the second light-emitting portion 42 on the base substrate, and an orthographic projection of the third carrier functional portion 313 on the base substrate 1 overlaps an orthographic projection of the third light-emitting portion 43 on the base substrate. The different carrier functional portions 30 are spaced apart from each other with a gap therebetween. The carrier functional portions 30 have a molecular chain, which is formed by cross-linking of monomers containing functional groups under light irradiation. In some embodiments, two olefin monomers (containing functional groups which are carbon-carbon double bonds) change to a cyclobutyl group (a ring composed of four carbons) after light irradiation. In some embodiments, a sulfhydryl group and an olefin as monomers are irradiated by light to obtain a thioether. That is, the two functional groups become an integral group after reaction, which is considered to be cross-linking.

In some embodiments, as the carrier functional layer includes carrier functional portions corresponding to the light-emitting portions, the carrier functional portions having a molecular chain, which is formed by cross-linking of monomers containing functional groups under light irradiation, thus a light-emitting functional film with functional groups may be formed before fabrication of the carrier functional layer of the display panel. The light-emitting functional film is irradiated by using a patterning mask, and light irradiated portions of the light-emitting functional film can be retained during subsequent cleaning with a solution and is not liable to be removed due to mutual cross-linking of the functional groups, while portions not irradiated by light, of the light-emitting functional film can be dissolved in the solution during subsequent cleaning with the solution and thus is removed. In this way, the light-emitting functional film is patterned by photolithography. This photolithography method of the carrier functional layer can be unified with the photolithography method of the light-emitting layer, which is beneficial to unified fabrication of multiple film layers of the display panel. Moreover, compared with an inkjet printing method for patterning, the photolithography method for patterning can achieve high-resolution fabrication of the display panel. In addition, for the carrier functional layer with the plurality of carrier functional portions obtained by the photolithography method, the thickness of the carrier functional portions corresponding to different light-emitting portions can be different, which is beneficial to carrier balance in regions of different emergent light wavebands. In some embodiments, the display panel includes a red light emerging region, a green light emerging region, and a blue light emerging region, and the light-emitting layer at different light emerging regions is made of different materials, and thus needs to be injected different numbers of carriers, while the different thicknesses of the carrier functional portions in different regions contribute to adjustment and control of the number of injected carriers, thereby achieving high light emitting efficiency of the display panel.

In some embodiments, the display panel further includes blocking dams 9 between adjacent light-emitting portions 30.

In some embodiments, the carrier functional portions 30 include nanoparticle hosts and ligands connected to the nanoparticle hosts, and the ligands have the functional groups. In this way, a thin film can be formed by direct cross-linking after light irradiation.

In some embodiments, the carrier functional portions 30 include nanoparticle hosts and an additive, and the additive has the functional groups. That is, the functional groups can be separately added as an additive to the system, and molecules containing the functional groups are cross-linked to form a network-like macromolecular immobilized nanomaterial.

In some embodiments, the carrier functional portions 30 further include a first product, which is a product of cross-linking reaction of the functional groups promoted by a photoinitiator or a photocatalyst. That is, to promote cross-linking of the functional groups during light irradiation, the photoinitiator or photocatalyst may be added when the carrier functional portions 30 are fabricated. For the finally formed display panel, the carrier functional portions 30 may include the first product generated after the reaction promoted by the photoinitiator or photocatalyst. In some embodiments, for example, the photoinitiator may specifically be azodiisobutyronitrile (azobisisobutyronitrile, AIBN), and the following reaction may occur during light irradiation:

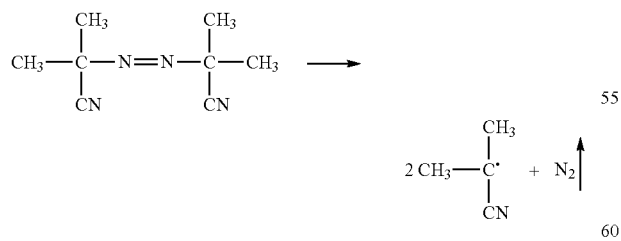

The first product may be $C(CH_3)_2(CN)$; of course, if AIBN does not completely react, the first product may also include AIBN itself, that is, $C(CH_3)_2(CN)N=NC(CH_3)_2(CN)$. In some embodiments, the photocatalyst is a photo acid generator (PAG), and PAG specifically has the following structural formula:

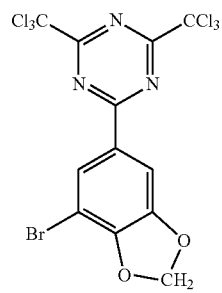

For the —$CCl_3$ moieties, after light irradiation, a Cl may be removed from one $CCl_3$ to form $CHCl_2$, then a Cl may be further removed therefrom to form $CH_2Cl_2$, or part of the Cl may be removed from both $CCl_3$, and the first product may specifically be one or a combination of:

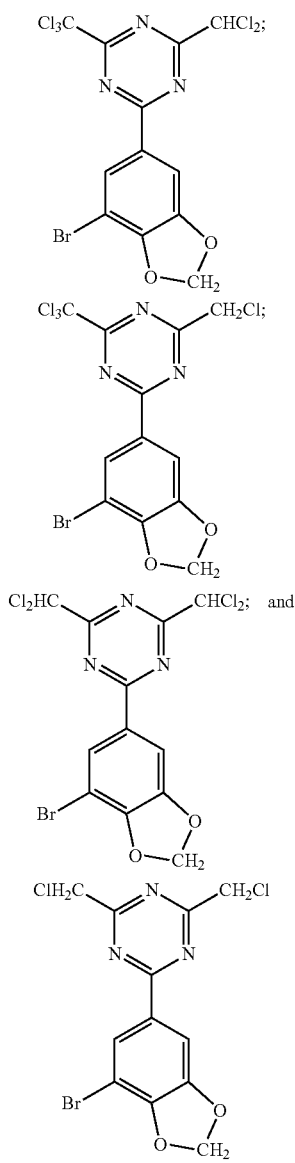

In some embodiments, PAG specifically has the following structural formula:

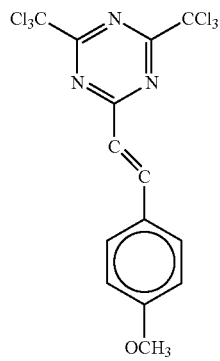

For the —CCl$_3$ moieties, after light irradiation, a Cl may be removed from one CCl$_3$ to form CHCl$_2$, then a Cl may be further removed therefrom to form CH$_2$Cl$_2$, or part of the Cl may be removed from both CCl$_3$, and the first product may specifically be one or a combination of:

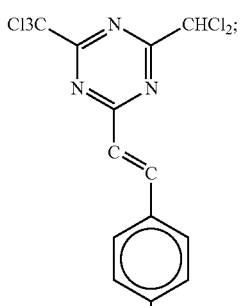

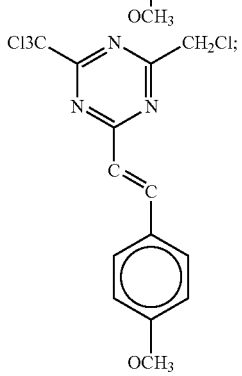

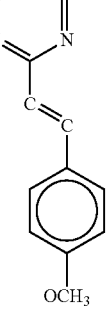

-continued

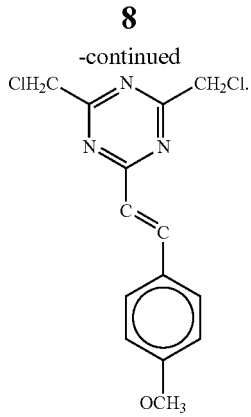

In some embodiments, PAG specifically has the following structural formula:

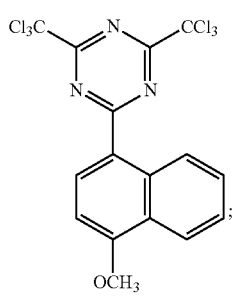

For the —CCl$_3$ moieties, after light irradiation, a Cl may be removed from one CCl$_3$ to form CHCl$_2$, then a Cl may be further removed therefrom to form CH$_2$Cl$_2$, or part of the Cl may be removed from both CCl$_3$, and the first product may specifically be one or a combination of:

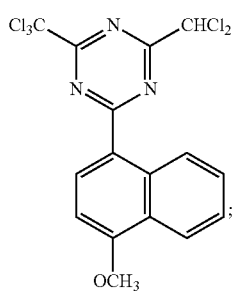

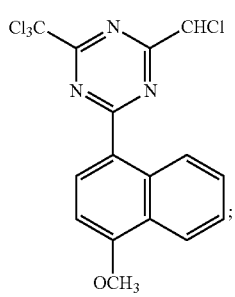

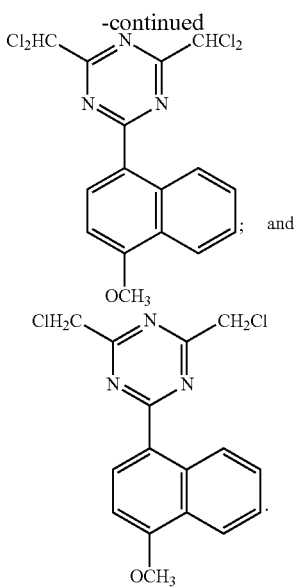

In some embodiments, if the reaction is not complete, the first product may also include PAG itself.

In some embodiments, the functional groups are one or a combination of: a carbon-carbon double bond; and an epoxy.

In some embodiments, the thicknesses of the carrier functional portions 30 corresponding to the light-emitting portions 40 with different emergent light wavebands are different. In some embodiments, referring to FIGS. 1 and 2, the thickness of the first carrier functional portion 311 corresponding to the first light-emitting portion 41 is greater than that of the second carrier functional portion 312 corresponding to the second light-emitting portion 42, and the thickness of the second carrier functional portion 312 corresponding to the second light-emitting portion 42 is greater than that of the third carrier functional portion 313 corresponding to the third light-emitting portion 43. In some embodiments, the thicknesses of the carrier functional portions 30 corresponding to the light-emitting portions 40 with different emergent light wavebands being different is beneficial to carrier balance adjustment in regions of different emergent light wavebands, thereby achieving high light emitting efficiency of the display panel.

In some embodiments, the light-emitting portions 40 include a first-type light-emitting portion and a second-type light-emitting portion. First carriers in a region where the first-type light-emitting portion is located are majority carriers, and first carriers in a region where the second-type light-emitting portion is located are minority carriers. The first carriers and carriers injected into the first electrode layer 21 are same in polarity. The carrier functional layer 3 is provided between the first electrode layer 21 and the light-emitting layer 4. The thickness of the carrier functional portion 30 corresponding to the first-type light-emitting portion is greater than that of the carrier functional portion 30 corresponding to the second-type light-emitting portion. For example, the first light-emitting portion 41 that emits red light may be used as the first-type light-emitting portion, and the second light-emitting portion 42 that emits green light may be used as the second-type light-emitting portion. The first electrode layer 21 is a cathode, and the first carriers are electrons. Electrons in a light-emitting device where the first-type light-emitting portion 41 that emits red light is located are majority carriers, and electrons in a light-emitting device where the second light-emitting portion 42 that emits green light is located are minority carriers. To achieve optimal carrier balance, for a device that emits red light (a region where the first light-emitting portion 41 is located), the carrier functional portion 30 needs to be thickened to reduce electron injection, while for a device that emits green light (a region where the second light-emitting portion 42 is located), the carrier functional portion 30 should be thinned to increase electron injection. In some embodiments, the first-type light-emitting portion and the second-type light-emitting portion may be determined according to the numbers of carriers of light-emitting devices emitting different color light determined by debugging in advance. For example, for a light-emitting device that emits red light, with the material of each film layer being determined, the luminous efficiency of the light-emitting device is tested and the thickness of an electron transport layer is adjusted for example. If the thickness of the electron transport layer is increased, it indicates that blocking electrons can improve the luminous efficiency. In this way, it is inversely deduced that there are more electrons in the light-emitting device before adjustment of the thickness of the transport layer, and the electrons as majority carriers need to be reduced. Similarly, if it is determined that electrons in a light-emitting device that emits green light are minority carriers, the thickness of the electron transport layer corresponding to the red light-emitting device can be made greater than the thickness of the electron transport layer of the green light-emitting device, to achieve balance adjustment and control of the carriers in the regions with different emergent light wavebands.

In some embodiments, in conjunction with FIGS. 1, 2 and 3, the first electrode layer 21 is located between the base substrate 1 and the light-emitting layer 4, and the second electrode layer 22 is located on a side of the light-emitting layer 4 away from the base substrate 1. The first electrode layer 21 may include a plurality of first electrodes 20 spaced apart from each other. The second electrode layer 22 may be a whole-layer structure.

In some embodiments, the display panel may have a conventional structure. For example, it may be a bottom emission panel having a conventional structure, or a top emission panel having a conventional structure. In some embodiments, it may also be an inverted structure. For example, it may be an inverted bottom emission structure, or an inverted top emission structure. This is described below with specific examples.

Figure 4:
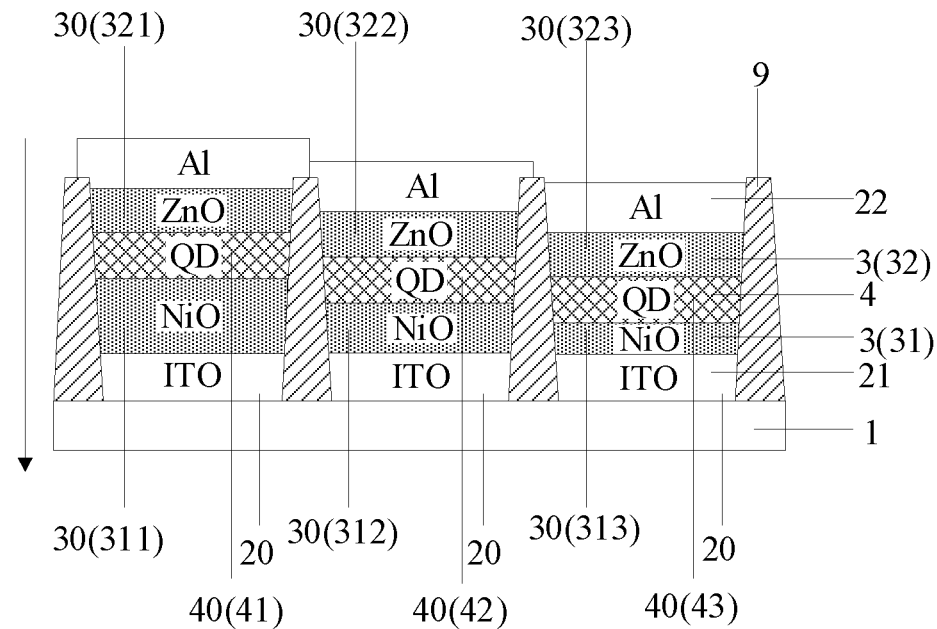
FIG. 4 is a schematic structural diagram of a bottom emission display panel having a conventional structure according to some embodiments.

In some embodiments, the display panel has a conventional structure with bottom emission structure. The first electrode layer 21 may be an anode layer, which is a transparent electrode, and the carrier functional layer 3 corresponding thereto may be a hole injection layer and/or a hole transport layer. The second electrode layer 22 is a cathode layer, the cathode is a reflective cathode, and the carrier functional layer 3 corresponding thereto may be an electron transport layer. In some embodiments, for example, referring to FIG. 4, the display panel may include a first electrode layer 21 (a transparent anode, which may specifically be made of indium tin oxide), a carrier functional layer 3 (a hole transport layer, which may specifically be made of NiO nanoparticles with functional groups), a light-emitting layer 4, a carrier functional layer 3 (an electron transport layer, which may specifically be made of ZnO), and a second electrode layer 22 (which may be made of Al), which are successively located on a side of the base substrate 1. The fabricating steps may be: 1) cleaning a glass substrate containing an ITO transparent electrode (anode) (e.g., cleaning the substrate with deionized water and ethanol and performing ultrasonic treatment for 20 minutes, then quickly blow-drying the same by using a nitrogen gun, and performing ozone treatment for 10 minutes to clean the ITO surface and improve a work function of the ITO electrode); 2) fabricating a hole transport layer (HT layer): coating the surface of the substrate with NiO nanoparticles having cross-linking ability, and performing grayscale exposure to obtain an HT layer with different thicknesses inside R/G/B pixels; 3) fabricating a light-emitting layer (QD): preparing quantum dot layers of the R/G/B pixels respectively by photolithography; 4) fabricating an electron transport layer: preparing a non-patterned ZnO layer by means of spraying or the like; and 5) fabricating a cathode: evaporating cathode electrode aluminum to obtain a quantum dot electroluminescent device, in which the thickness of the HT and QD layers may be controlled separately, while the thickness of ZnO may be unified.

Figure 5:
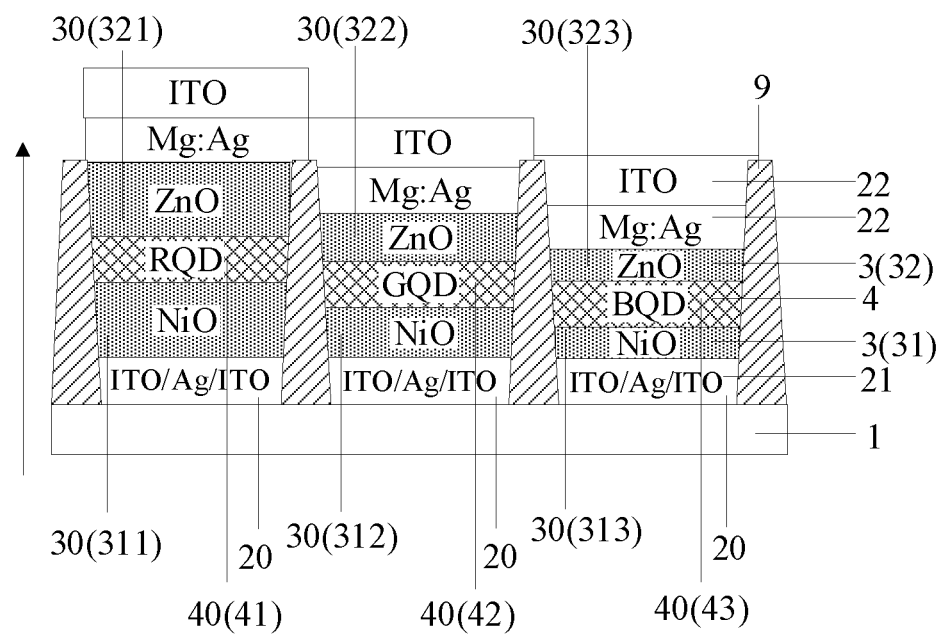
FIG. 5 is a schematic structural diagram of a top emission display panel having a conventional structure according to some embodiments.

In some embodiments, the display panel has a conventional structure and is a top emission structure. The first electrode layer 21 may be a reflective anode, and the carrier functional layer 3 corresponding thereto may be a hole injection layer and/or a hole transport layer; and the second electrode layer 22 is a cathode layer, the cathode being a transparent electrode, and the carrier functional layer 3 corresponding thereto may be an electron transport layer. In some embodiments, referring to FIG. 5, the display panel may include a first electrode layer 21 (a reflective anode, which may be made of ITO/Ag/ITO), a carrier functional layer 3 (a hole transport layer HT, which may be made of NiO nanoparticles with functional groups), a light-emitting layer 4, a carrier functional layer 3 (an electron transport layer, which may be made of ZnO), a second electrode layer 22 (a semi-transmissive cathode, which may be made of Mg:Ag/ITO; on the one hand it serves as a cathode to provide electrons; on the other hand it has a certain transmittance as an electrode through which light is emitted from the device), which are successively located on a side of the base substrate 1. For a red light-emitting device (i.e. a region where the first light-emitting portion 41 is located), G-QLED:ITO (100 nm)/Ag (100 nm)/ITO (100 nm)/NiO (60 nm)/QD (25 nm)/ZnO (75 nm)/Mg:Ag (30 nm)/ITO (200 nm); for a green light-emitting device (i.e. a region where the second light-emitting portion 42 is located), G-QLED:ITO (100 nm)/Ag (100 nm)/ITO (100 nm)/NiO (40 nm)/QD (20 nm)/ZnO (65 nm)/Mg:Ag (30 nm)/ITO (200 nm); for a blue light-emitting device (i.e. a region where the third light-emitting portion 43 is located), R-QLED:ITO (100 nm)/Ag (100 nm)/ITO (100 nm)/NiO (35 nm)/QD (20 nm)/ZnO (40 nm)/Mg:Ag (30 nm)/ITO (200 nm). The fabricating steps may be: 1) cleaning a glass substrate containing an ITO/Ag/ITO anode (cleaning the substrate with deionized water and ethanol and performing ultrasonic treatment for 20 minutes, then quickly blow-drying the same by using a nitrogen gun, and performing ozone treatment for 10 minutes to clean the ITO surface and improve a work function of the ITO electrode; 2) fabricating a hole transport layer (HT layer): coating the surface of the substrate with NiO nanoparticles having cross-linking ability, and performing grayscale exposure to obtain an HT layer with different thicknesses inside R/G/B pixels, wherein the thickness of the R pixel is 60 nm, the thickness of the G pixel is 40 nm, and the thickness of the B pixel is 35 nm; 3) fabricating a light-emitting layer: preparing quantum dot layers of the R/G/B pixels respectively by photolithography, where the thickness of the R pixel is 25 nm, the thickness of the G pixel is 20 nm, and the thickness of the B pixel is 20 nm; 4) fabricating an electron transport layer (ET layer): coating the surface of the substrate with ZnO nanoparticles having cross-linking ability, and performing grayscale exposure to obtain an ET layer with different thicknesses inside the R/G/B pixels, where the thickness of the R pixel is 75 nm, the thickness of the G pixel is 65 nm, and the thickness of the B pixel is 40 nm; and 5) fabricating a cathode: preparing Mg:Ag of 30 nm by an evaporation method, and then sputtering ITO of 200 nm to obtain a semi-transmissive cathode. On the one hand, Mg:Ag as the cathode has a work function that matches ZnO better than ITO. On the other hand, particles may damage the ZnO layer when ITO is sputtered. Therefore, Mg:Ag also serves as a buffer layer to protect ZnO. It is to be noted that for a bottom emission device, it only needs to consider the balance of carriers, and optical effects are substantially not considered. Therefore, even if the film thickness is not an optimal one that satisfies the balance of carriers, the performance loss of the device is limited. For a top emission device, in addition to the carrier balance, it also needs to control an optical micro-cavity effect. Therefore, if the film thickness is not appropriate, a carrier imbalance affects the efficiency on the one hand, and the micro-cavity effect also affects the efficiency on the other hand. Therefore, the thickness of each layer needs to be adjusted more accurately in the top emission device.

Figure 6:
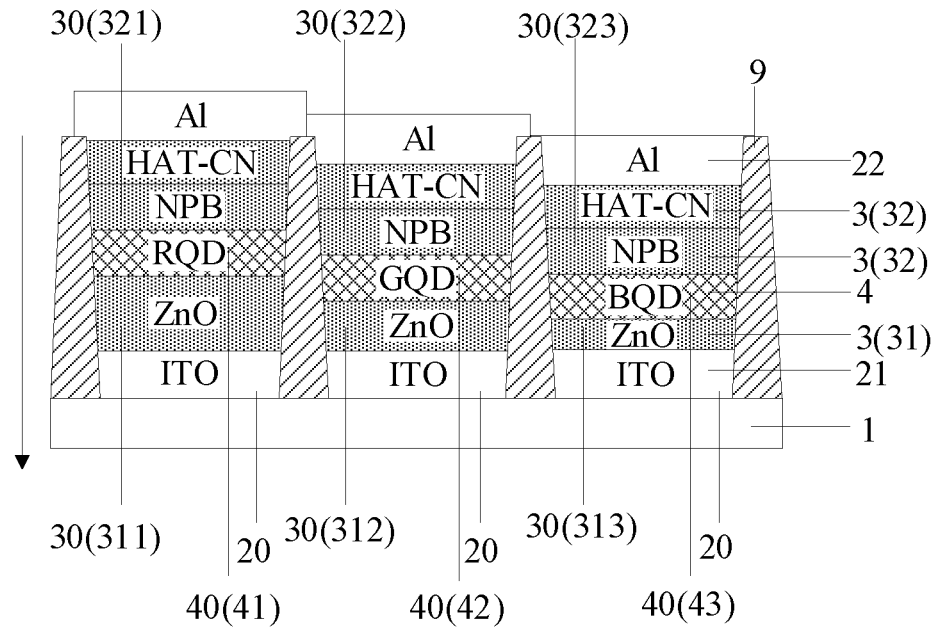
FIG. 6 is a schematic structural diagram of a bottom emission display panel having an inverted structure according to some embodiments.

In some embodiments, the display panel is an inverted bottom emission structure. The first electrode layer 21 is a transparent cathode, and the carrier functional layer 3 corresponding thereto is an electron injection layer and/or an electron transport layer; and the second electrode layer 22 is an anode, which is a reflective anode, and the carrier functional layer 3 corresponding thereto is a hole injection layer and/or a hole transport layer. In some embodiments, referring to FIG. 6, the display panel may include a first electrode layer 21 (a transparent cathode, which may be made of ITO), a carrier functional layer 3 (an electron transport Layer ET, which may be made of ZnO nanoparticles with functional groups), a light-emitting layer 4, a carrier functional layer 3 (a hole transport layer, which may be made of N,N'-diphenyl-N,N'-(1-naphthyl)-1,1'-biphenyl-4,4'-diamine, NPB), a carrier functional layer 3 (a hole injection layer, which may be made of HAT-CN), and a second electrode layer 22 (a reflective anode, which may be made of Al), which are successively located on a side of the base substrate 1. For a red light-emitting device (i.e. a region where the first light-emitting portion 41 is located), RQD: ITO (100 nm)/ZnO (50 nm)/RQD (20 nm)/NPB (25 nm)/HAT-CN (20 nm)/Al (100 nm); for a green light-emitting device (i.e. a region where the second light-emitting portion 42 is located), GQD:ITO (100 nm)/ZnO (35 nm)/GQD (20 nm)/NPB (25 nm)/HAT-CN (20 nm)/Al (100 nm); for a blue light-emitting device (i.e. a region where the third light-emitting portion 43 is located), BQD:ITO (100 nm)/ZnO (20 nm)/BQD (20 nm)/NPB (25 nm)/HAT-CN (20 nm)/Al (100 nm). The fabricating steps may be: 1) cleaning a glass substrate containing an ITO transparent electrode (cathode): cleaning the substrate with deionized water and ethanol and performing ultrasonic treatment for 20 minutes, then quickly blow-drying the same by using a nitrogen gun, and performing ozone treatment for 10 minutes to clean the ITO surface and improve a work function of the ITO electrode; 2) fabricating an electron transport layer (ET): coating the surface of the substrate with ZnO nanoparticles having cross-linking ability and performing grayscale exposure to obtain an ET layer with different thicknesses inside R/G/B pixels, wherein the thickness of the R pixel is 50 nm, the thickness of the G pixel is 35 nm, and the thickness of the B pixel is 20 nm; 3) fabricating a light-emitting layer: preparing quantum dot layers of the R/G/B pixels respectively by photolithography, the thicknesses of the layers being 20 nm; 4) fabricating a hole transport layer: evaporating HT, HI and other materials by using an open mask to obtain non-patterned NPB of 25 nm and HAT-CN of 20 nm; and 5) fabricating a cathode: evaporating aluminum of 100 nm as the cathode to obtain a quantum dot electroluminescent device of the embodiment.

Figure 7:
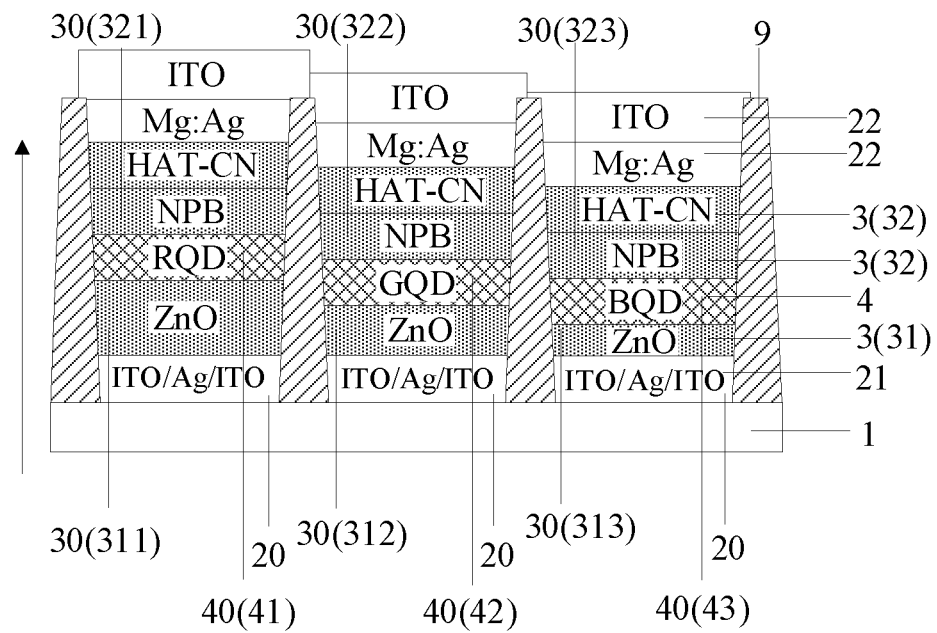
FIG. 7 is a schematic structural diagram of a top emission display panel having an inverted structure according to some embodiments.

In some embodiments, the display panel is an inverted top emission structure. The first electrode layer 21 is a reflective cathode, and the carrier functional layer 3 corresponding thereto is an electron injection layer and/or an electron transport layer; and the second electrode layer 22 is a transparent anode, and the carrier functional layer 3 corresponding thereto is a hole injection layer and/or a hole transport layer. In some embodiments, referring to FIG. 7, the display panel may include a first electrode layer 21 (a reflective cathode, which may be made of ITO/Ag/ITO), a carrier functional layer 3 (an electron transport layer ET, which may be made of ZnO nanoparticles with functional groups), a light-emitting layer 4, a carrier functional layer 3 (a hole transport layer, which may be made of N,N'-diphenyl-N,N'-(1-naphthyl)-1,1'-biphenyl-4,4'-diamine, NPB), a carrier functional layer 3 (a hole injection layer, which may be made of HAT-CN), and a second electrode layer 22 (a semi-transmissive anode, which may be made of Mg:Ag/ITO), which are successively located on a side of the base substrate 1. For a red light-emitting device (i.e. a region where the first light-emitting portion 41 is located), RQD: ITO (100 nm)/ZnO (50 nm)/RQD (20 nm)/NPB (25 nm)/HAT-CN (20 nm)/Al (100 nm); for a green light-emitting device (i.e. a region where the second light-emitting portion 42 is located), GQD:ITO (100 nm)/ZnO (35 nm)/GQD (20 nm)/NPB (25 nm)/HAT-CN (20 nm)/Al (100 nm); for a blue light-emitting device (i.e. a region where the third light-emitting portion 43 is located), BQD: ITO (100 nm)/ZnO (20 nm)/BQD (20 nm)/NPB (25 nm)/HAT-CN (20 nm)/Al (100 nm). The fabricating steps may be: 1) cleaning a glass substrate containing an ITO/Ag/ITO reflective cathode: cleaning the substrate with deionized water and ethanol and performing ultrasonic treatment for 20 minutes, then quickly blow-dry the same by using a nitrogen gun, and performing ozone treatment for 10 minutes to clean the ITO surface and improve a work function of the ITO electrode; 2) fabricating an electron transport layer (ET): coating the surface of the substrate with ZnO nanoparticles having cross-linking ability, and performing grayscale exposure to obtain an ET layer with different thickness inside R/G/B pixels, where the thickness of the R pixel is 50 nm, the thickness of the G pixel is 35 nm, and the thickness of the B pixel is 20 nm; 3) fabricating a light-emitting layer: preparing quantum dot layers of the R/G/B three pixels respectively by photolithography, the thicknesses of the layers being 20 nm; 4) fabricating a hole transport layer: evaporating HT, HI and other materials by using an open mask to obtain non-patterned NPB of 25 nm and HAT-CN of 20 nm; and 5) fabricating an anode: preparing Mg:Ag of 30 nm by an evaporation method, and sputtering ITO of 200 nm to obtain a semi-transmissive cathode.

In some embodiments, a display device is provided, and includes the display panel above.

Figure 8:
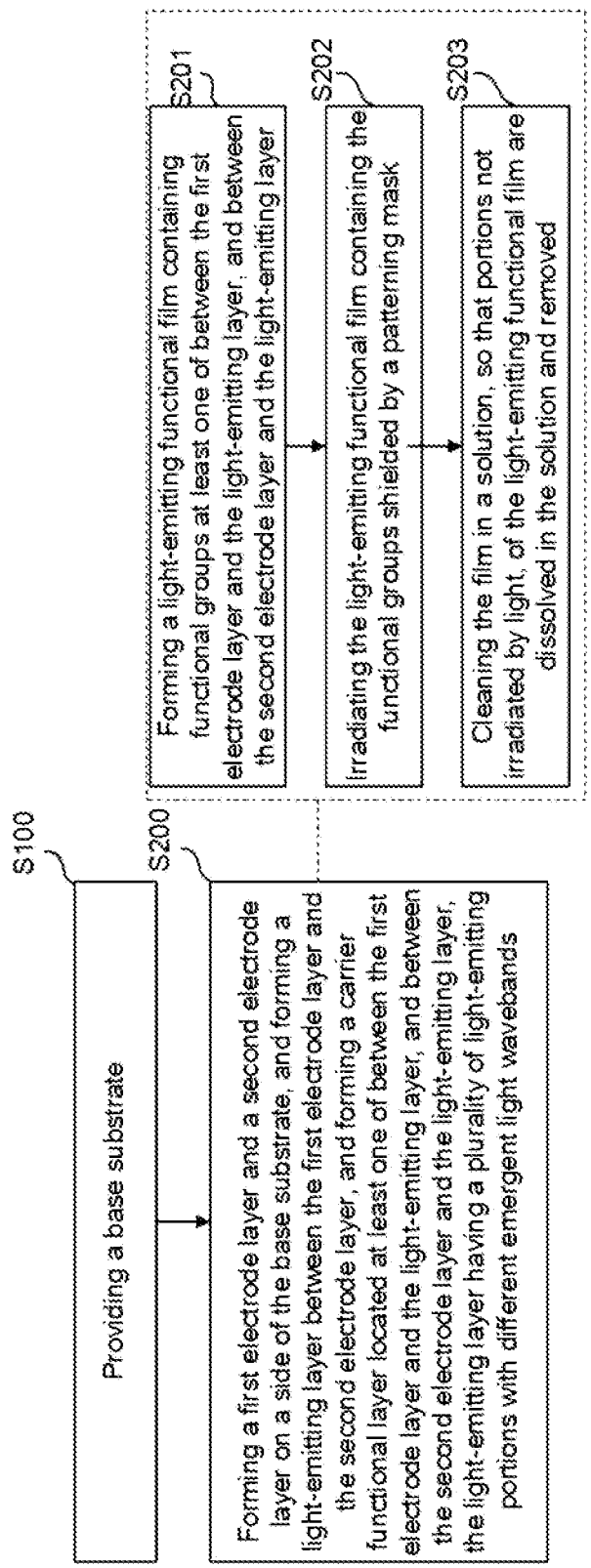
FIG. 8 is a schematic flow diagram of a fabricating method of a display panel according to some embodiments.

In some embodiments, a manufacturing method of the display panel above is provided. Referring to FIG. 8, the method includes:

S100, providing a base substrate;

S200, forming a first electrode layer and a second electrode layer on a side of the base substrate, and forming a light-emitting layer between the first electrode layer and the second electrode layer, and forming a carrier functional layer located at least one of between the first electrode layer and the light-emitting layer, and between the second electrode layer and the light-emitting layer, the light-emitting layer having a plurality of light-emitting portions with different emergent light wavebands;

wherein forming a carrier functional layer located at least one of between the first electrode layer and the light-emitting layer, and between the second electrode layer and the light-emitting layer includes:

S201, forming a light-emitting functional film containing functional groups at least one of between the first electrode layer and the light-emitting layer, and between the second electrode layer and the light-emitting layer;

S202, irradiating the light-emitting functional film containing the functional groups shielded by a patterning mask, to allow the functional groups in the light-emitting functional film irradiated by light to be cross-linked with each other; and in some embodiments, performing a grayscale exposure process to form the carrier functional portions with different thicknesses in regions corresponding to the light-emitting portions with different emergent light wavebands; and S203, cleaning the film in a solution, so that portions not irradiated by light, of the light-emitting functional film are dissolved in the solution and removed.

Embodiments of the present disclosure have the following beneficial effects: In the embodiments of the present disclosure, as the carrier functional layer includes carrier functional portions corresponding to the light-emitting portions, the carrier functional portions having functional groups subjected to light irradiation, thus a light-emitting functional film with functional groups may be formed before fabrication of the carrier functional layer of the display panel. The light-emitting functional film is irradiated by using a patterning mask, and light irradiated portions of the light-emitting functional film can be retained during subsequent cleaning with a solution and is not liable to be removed due to mutual cross-linking of the functional groups, while portions not irradiated by light, of the light-emitting functional film can be dissolved in a solution during subsequent cleaning with the solution and thus is removed. In this way, the light-emitting functional film is patterned by photolithography. This photolithography method of the carrier functional layer can be unified with the photolithography method of the light-emitting layer, which is beneficial to unified fabrication of multiple film layers of the display panel. Moreover, compared with an inkjet printing method for patterning, the photolithography method for patterning can achieve high-resolution fabrication of the display panel. In addition, for the carrier functional layer with the plurality of carrier functional portions obtained by the photolithography method, the thickness of the carrier functional portions corresponding to different light-emitting portions can be different, which contribute to carrier balance in regions of different emergent light wavebands (for example, the display panel includes a red light emerging region, a green light emerging region, and a blue light emerging region, and the light-emitting layer at different light emerging regions is made of different materials, and thus needs to be injected different numbers of carriers, while difference of the carrier functional portions in different regions can contribute to adjustment and control of the number of injected carriers), thereby achieving high light extraction efficiency of the display panel.

Obviously, those skilled in the art can make various modifications and variations to the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. A display panel, comprising:
   a base substrate;
   a first electrode layer and a second electrode layer on a side of the base substrate;
   a light-emitting layer between the first electrode layer and the second electrode layer; and
   a carrier functional layer located at least one of between the first electrode layer and the light-emitting layer, and between the second electrode layer and the light-emitting layer;
   wherein
   the light-emitting layer has a plurality of light-emitting portions with different emergent light wavebands; and
   the carrier functional layer has a plurality of carrier functional portions corresponding to the plurality of light-emitting portions, the plurality of carrier functional portions having molecular chains, which is formed by cross-linking of monomers containing functional groups under light irradiation;
   wherein the plurality of light-emitting portions comprise first-type light-emitting portions and second-type light-emitting portions; wherein
   first carriers in a region where a first-type light-emitting portion is located are majority carriers, and first carriers in a region where a second-type light-emitting portion is located are minority carriers; when the first electrode layer is a cathode layer, the first carriers are electrons, the first-type light-emitting portion emits red light, and the second-type light-emitting portion emits green light;
   the electrons in the region where the first-type light-emitting portion is located and carriers injected into the first electrode layer corresponding to the first-type light-emitting portion are same in polarity, and the electrons in the region where the second-type light-emitting portion is located and carriers injected into the first electrode layer corresponding to the second-type light-emitting portion are same in polarity;
   wherein the plurality of carrier functional portions each comprises a first product, which is a product of cross-linking reaction of the functional groups promoted by a photoinitiator or a photocatalyst; and
   wherein the photoinitiator is azobisisobutyronitrile, and the photocatalyst is a photoacid generator.

2. The display panel of claim 1, wherein the plurality of carrier functional portions each comprises nanoparticle hosts and ligands connected to the nanoparticle hosts, and the ligands have the functional groups.

3. The display panel of claim 1, wherein the plurality of carrier functional portions each comprises nanoparticle hosts and an additive, and the additive has the functional groups.

4. The display panel of claim 1, wherein the functional groups are one or a combination of:
   a carbon-carbon double bond; and
   an epoxy.

5. The display panel of claim 1, wherein thicknesses of the plurality of carrier functional portions corresponding to the plurality of light-emitting portions with different emergent light wavebands are different.

6. The display panel of claim 5, wherein the first electrode layer is disposed between the base substrate and the light-emitting layer, and the second electrode layer is disposed on a side of the light-emitting layer facing away from the base substrate.

7. The display panel of claim 6, wherein
   the first electrode layer is the cathode layer, and the carrier functional layer corresponding thereto is an electron injection layer and/or an electron transport layer; and
   the second electrode layer is an anode layer, and the carrier functional layer corresponding thereto is a hole injection layer and/or a hole transport layer.

8. The display panel of claim 7, wherein the carrier functional layer is provided between the first electrode layer and the light-emitting layer; and a thickness of the carrier functional portion corresponding to the first-type light-emitting portion is greater than a thickness of the carrier functional portion corresponding to the second-type light-emitting portion.

9. The display panel of claim 7, wherein
   the anode layer is a transparent anode, and the cathode layer is a reflective cathode; or
   the anode layer is a reflective anode, and the cathode layer is a transparent electrode.

10. A display device, comprising a display panel, wherein the display panel comprises:
    a base substrate;
    a first electrode layer and a second electrode layer on a side of the base substrate;
    a light-emitting layer between the first electrode layer and the second electrode layer; and
    a carrier functional layer located at least one of between the first electrode layer and the light-emitting layer, and between the second electrode layer and the light-emitting layer;
    wherein
    the light-emitting layer has a plurality of light-emitting portions with different emergent light wavebands; and
    the carrier functional layer has a plurality of carrier functional portions corresponding to the plurality of light-emitting portions, the plurality of carrier functional portions having molecular chains, which is formed by cross-linking of monomers containing functional groups under light irradiation;
    wherein the plurality of light-emitting portions comprise first-type light-emitting portions and second-type light-emitting portions; wherein
    first carriers in a region where a first-type light-emitting portion is located are majority carriers, and first carriers in a region where a second-type light-emitting portion is located are minority carriers; when the first electrode layer is a cathode layer, the first carriers are electrons, the first-type light-emitting portion emits red light, and the second-type light-emitting portion emits green light;
    the electrons in the region where the first-type light-emitting portion is located and carriers injected into the first electrode layer are same in polarity, and the electrons in the region where the second-type light-emitting portion is located and carriers injected into the first electrode layer corresponding to the second-type light-emitting portion are same in polarity;

wherein the plurality of carrier functional portions each comprises a first product, which is a product of cross-linking reaction of the functional groups promoted by a photoinitiator or a photocatalyst; and wherein the photoinitiator is azobisisobutyronitrile, and the photocatalyst is a photoacid generator.

11. A fabricating method of a display panel, the display panel comprising:

a base substrate;

a first electrode layer and a second electrode layer on a side of the base substrate;

a light-emitting layer between the first electrode layer and the second electrode layer; and a carrier functional layer located at least one of between the first electrode layer and the light-emitting layer, and between the second electrode layer and the light-emitting layer;

wherein the light-emitting layer has a plurality of light-emitting portions with different emergent light wavebands; and the carrier functional layer has a plurality of carrier functional portions corresponding to the plurality of light-emitting portions, the plurality of carrier functional portions having molecular chains, which is formed by cross-linking of monomers containing functional groups under light irradiation;

wherein the plurality of light-emitting portions comprise first-type light-emitting portions and second-type light-emitting portions; wherein first carriers in a region where a first-type light-emitting portion is located are majority carriers, and first carriers in a region where a second-type light-emitting portion is located are minority carriers; when the first electrode layer is a cathode layer, the first carriers are electrons, the first-type light-emitting portion emits red light, and the second-type light-emitting portion emits green light; the electrons in the region where the first-type light-emitting portion is located and carriers injected into the first electrode layer corresponding to the first-type light-emitting portion are same in polarity, and the electrons in the region where the second-type light-emitting portion is located and carriers injected into the first electrode layer corresponding to the second-type light-emitting portion are same in polarity;

wherein the plurality of carrier functional portions each comprises a first product, which is a product of cross-linking reaction of the functional groups promoted by a photoinitiator or a photocatalyst; wherein the photoinitiator is azobisisobutyronitrile, and the photocatalyst is a photoacid generator;

the method comprising:

providing the base substrate;

forming the first electrode layer and the second electrode layer on the side of the base substrate;

forming the light-emitting layer between the first electrode layer and the second electrode layer;

forming the carrier functional layer located at least one of between the first electrode layer and the light-emitting layer, and between the second electrode layer and the light-emitting layer;

wherein forming the carrier functional layer located at least one of between the first electrode layer and the light-emitting layer, and between the second electrode layer and the light-emitting layer comprises:

forming a light-emitting functional film containing functional groups at least one of between the first electrode layer and the light-emitting layer, and between the second electrode layer and the light-emitting layer;

irradiating the light-emitting functional film containing the functional groups shielded by a patterning mask, to allow the functional groups in the light-emitting functional film irradiated by light to be cross-linked with each other; and cleaning the light-emitting functional film in a solution, to make portions not irradiated by light, of the light-emitting functional film be dissolved in the solution and removed.

12. The fabricating method of claim 11, wherein irradiating the light-emitting functional film containing the functional groups shielded by a patterning mask comprises:

performing a grayscale exposure process to form the plurality of carrier functional portions with different thicknesses in regions corresponding to the plurality of light-emitting portions with different emergent light wavebands.

* * * * *